US008539299B2

(12) United States Patent
Yue et al.

(10) Patent No.: US 8,539,299 B2
(45) Date of Patent: Sep. 17, 2013

(54) LT DECODING AND RETRANSMISSION FOR WIRELESS BROADCAST

(75) Inventors: Guosen Yue, Plainsboro, NJ (US); Momin A. Uppal, Lahore (PK); Xiaodong Wang, New York, NY (US)

(73) Assignee: NEC Laboratories America, Inc., Princeton, NJ (US)

( * ) Notice: Subject to any disclaimer, the term of this patent is extended or adjusted under 35 U.S.C. 154(b) by 192 days.

(21) Appl. No.: 13/023,667

(22) Filed: Feb. 9, 2011

(65) Prior Publication Data

US 2011/0246848 A1    Oct. 6, 2011

Related U.S. Application Data

(60) Provisional application No. 61/321,228, filed on Apr. 6, 2010.

(51) Int. Cl.
*H03M 13/00* (2006.01)

(52) U.S. Cl.
USPC ............................. 714/751; 714/748; 714/758

(58) Field of Classification Search
USPC .................. 714/751, 748, 704, 780, 758, 800, 714/774, 779
See application file for complete search history.

(56) References Cited

U.S. PATENT DOCUMENTS

| 7,945,842 B2* | 5/2011 | He et al. ........................ 714/779 |
| 8,275,322 B2* | 9/2012 | Khojastepour et al. ....... 455/63.1 |
| 2010/0239048 A1* | 9/2010 | Lee et al. ...................... 375/297 |

OTHER PUBLICATIONS

Hagedorn, A. et al., "Rateless Coding With Feedback", in Proc. IEEE Conference on Computer Communications INFOCOM, Apr. 2009, pp. 1791-1799.
Kokalj-Filipovic, S. et al., "Doped Fountain Coding for Minimum Delay Data Collection in Circular Networks", IEEE Journal on selected areas in communications, vol. 27 No. 5, Jun. 2009, pp. 673-684.
N. Bonello et al. "Reconfigurable Rate less Codes," IEEE Trans. on Wireless Communications, vol. 8, No. 11, Nov. 2009. See abstract, figure 1, pp. 5594, 5595.
S. Kokalj-Filipovic et al. "Doped fountain coding for minimum delay data collection in circular networks," IEEE J. Select. Area Commun., vol. 27, No. 5, pp. 673-684, Jun. 2009. See abstract, section IV.

* cited by examiner

*Primary Examiner* — Fritz Alphonse
(74) *Attorney, Agent, or Firm* — Joseph Kolodka

(57) ABSTRACT

Methods and systems for doped rateless retransmission include receiving ratelessly coded symbols. An attempt is made to decode the coded symbols using a processor by creating an associated code graph that represents the structure of the rateless code used by the symbols. If the decoding attempt fails, an input node is selected from the code graph using a metric that gauges the number and degree of connections to the input node based on the code graph structure. The selected input node is then requested for retransmission of the selected input node by a feedback channel.

22 Claims, 7 Drawing Sheets

LT DECODING AND RETRANSMISSION FOR WIRELESS BROADCAST

RELATED APPLICATION INFORMATION

This application claims priority to provisional application Ser. No. 61/321,228 filed on Apr. 6, 2010, incorporated herein by reference.

BACKGROUND

1. Technical Field

The present invention relates to rateless coded transmission and, in particular, to systems and methods for information retransmission using rateless codes.

2. Description of the Related Art

Rateless codes, such as Luby-Transform (LT) codes, are commonly used for data transmission without feedback information. In a rateless code, transmission of a piece of information (rateless coded bits or symbols) can continue indefinitely, until such time as the receiver has enough information (rateless coded bits or symbols) to decode the information (original data bits or symbols before encoding). In such a code, there is no fixed proportion between the amount of information sent to the amount of information encoded—hence the term "rateless."

If limited feedback is allowed in a rateless coded system, the system can convey a certain amount of information to the transmitter to improve the data recovery performance. In particular, the receiver may request retransmission in a process called "doping." However, extant doping systems are wasteful, having unnecessarily high doping rates that result in wasted retransmissions.

SUMMARY

A method for doped rateless decoding includes receiving ratelessly coded symbols and attempting to decode the coded symbols using a processor by creating an associated code graph that represents the structure of the rateless code used by the symbols. If the decoding attempt fails, an input node is selected from the code graph using a metric that gauges the number and degree of connections to the input node based on the code graph structure. The method further includes requesting retransmission of the selected input node by a feedback channel.

A method for rateless doped retransmission includes receiving retransmission requests from one or more feedback channels and selecting a ratelessly encoded packet requested by a plurality of the one or more feedback channels using a processor. If there is no plurality, a ratelessly encoded packet is selected according to a doping transmission criterion. The method further includes retransmitting the selected packet to one or more receivers.

A receiver includes a decoder configured to decode received coded symbols using a processor by creating an associated code graph that represents the structure of the rateless code used by the symbols, a doping request mechanism configured to select an input node from the code graph using a metric that gauges the number and degree of connections to the input node based on the code graph structure if the decoder fails to decide a received symbol, and a feedback transmitter configured to request retransmission of the selected input node by a feedback channel.

A transmitter includes a feedback receiver configured to receive retransmission requests from one or more feedback channels, a transmission controller configured to select a packet requested by a plurality of the one or more feedback channels using a processor and, if there is no plurality, configured to select a packet according to a doping transmission criterion, and a broadcast unit configured to transmit the selected packet to one or more receivers.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Although packets for doping may be selected randomly, it is possible to improve on this method significantly. By analyzing the graph associated with a given code, and by considering the history of doping selections, substantial improvements can be made over random selection by choosing particular doping packets that will provide the most benefit in retransmission.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
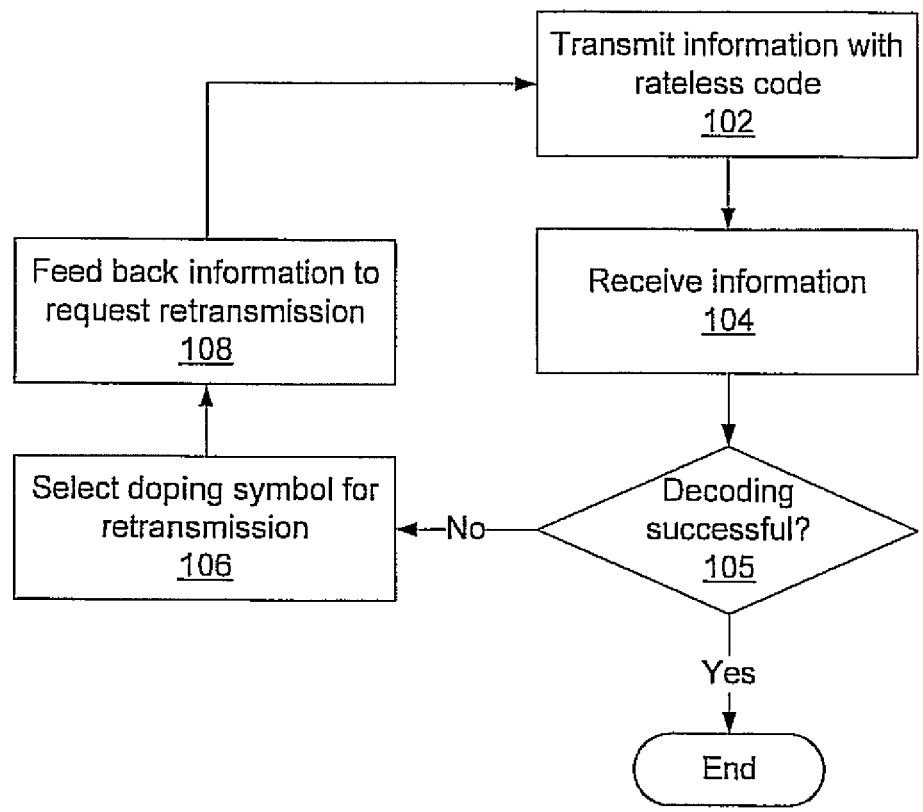
FIG. 1 is a block/flow diagram showing doped rateless decoding.

Referring now in detail to the figures in which like numerals represent the same or similar elements and initially to FIG. 1, block/flow diagram illustrating a doping method is shown which reduces the average doping rate (or number of retransmissions) compared with random doping. Block 102 transmits information that is encoded with a rateless code, such as a Luby-Transform (LT) code. Block 104 receives said encoded information after it has passed through a communication channel and suffered some amount of degradation. Decision block 105 attempts to decode the information. If decoding is successful, the process ends. If decoding fails (due to errors in transmission), block 106 selects a doping symbol for retransmission in accordance with the inventive principles described below. Block 108 then feeds back the retransmission request to block 102, which retransmits information accordingly. The process continues until decoding succeeds. Although binary rateless codes are used hereinbelow for the purpose of illustration, it should be understood that non-binary rateless codes may be used as well.

For LT codes, the inputs and outputs of the LT encoder can be either a bit sequence or a packet sequence, and the term "symbol" can represent either a bit or a packet. Symbols which represent raw information are referred to herein as "input symbols" and symbols which have been encoded for transmission are referred to as "output symbols." In an LT code, every output symbol is simply the single parity check (SPC) coded symbol for a certain number of input symbols. The number of input symbols for generating an output symbol follows a certain distribution. A good degree distribution for LT codes, one which satisfies the property of input bits being added to the decoding ripple at the same rate as they are processed, is the ideal Soliton distribution for a length-k information sequence, given by:

$$\rho(d) = \begin{cases} 1/k, & d = 1 \\ \frac{1}{d(d-1)}, & d = 2, \ldots, k, \end{cases}$$

where the sequence d is independently and identically distributed and follows the distribution $\rho(d)$. Although the ideal Soliton distribution displays ideal behavior in terms of the expected number of encoding symbols needed to recover the data for iterative LT decoding, it is fragile and works poorly in practice. The robust Soliton distribution is then introduced to guarantee certain expected ripple size. Given design parameters of c>0 and $\delta$, the robust Soliton distribution for a length-k information sequence is defined as:

$$v(d) = \frac{\rho(d) + \tau(d)}{\sum_{j=1}^{k}(\rho(j) + \tau(j))}, i = 1, \ldots, k,$$

where $\rho(d)$ follows the ideal Soliton distribution, R=c ln(k/$\delta$) $\sqrt{k}$, and $$\tau(d) = \begin{cases} \frac{R}{dk} & d = 1, \ldots, k/R-1, \\ R\ln(R/\delta)/k, & d = k/R \\ 0 & d = k/R+1 \ldots, k. \end{cases}$$

where $\delta$ is the overhead.

Figure 2:
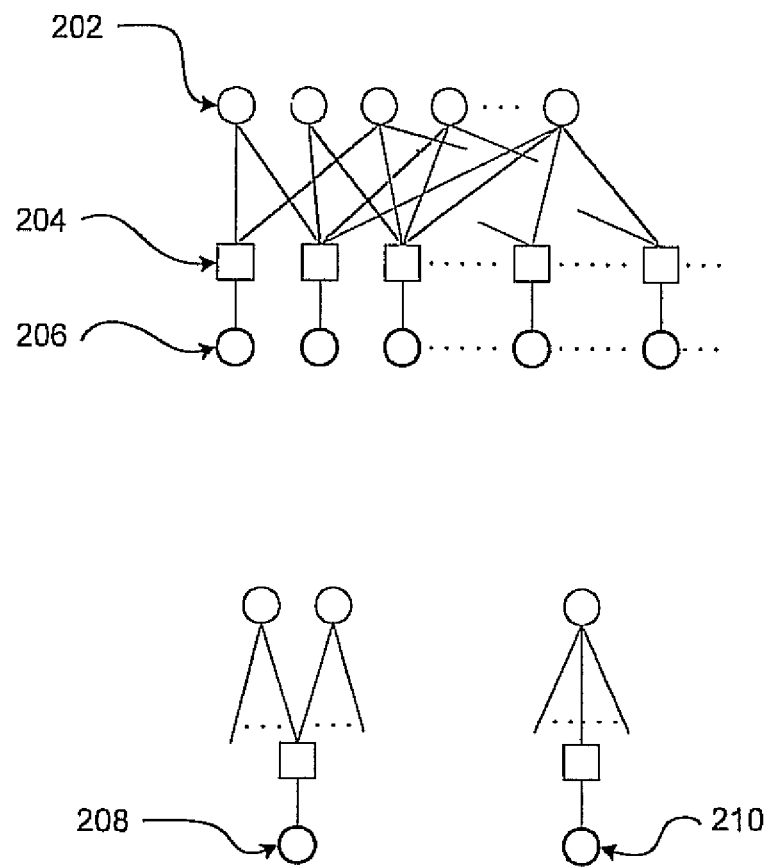
FIG. 2 is a diagram illustrating a Luby-Transform code graph.

Referring now to FIG. 2, a code graph representation of an LT code is shown, wherein the output nodes 206 represent the output symbols and the input nodes 202 representing the input symbols are connected by edges through SPC constraint nodes or SPC check nodes 204.

After receiving a certain number of output symbols, a decoder finds all of the output symbols that are connected with only one input symbol. These are called degree-1 output nodes 210. Connection to a degree-1 output node 210 identifies the input symbol and allows for decoding. For each newly decoded input symbol, any output symbols connected to said decoded input symbol are updated a by binary addition operation with the input symbol. After updating the output symbols with all of the decoded input symbols in a given decoding iteration, and after all of the connections from said decoded input symbols have been removed, new degree-1 output symbols may arise in the updated code graph. Another decoding iteration then starts. The set of the degree-1 nodes 210 for the updated code graph during the decoding process is called ripple. Because every degree-1 output symbol can be identified with a single connected input node 202, the input nodes 202 connected to degree-1 output symbols are also called ripple. As long as the size of the ripple is not zero, the decoding process continues. Otherwise, the decoding process stops. Thus a ripple of zero results in a decoding failure, where some input symbols remain that have not been successfully decoded. When the decoding ripple vanishes, the iterative LT decoding is suspended. If feedback is allowed, the retransmission request of an information symbol can be sent to the transmitter. The transmitter then follows the request and transmits the input symbol.

Figure 3:
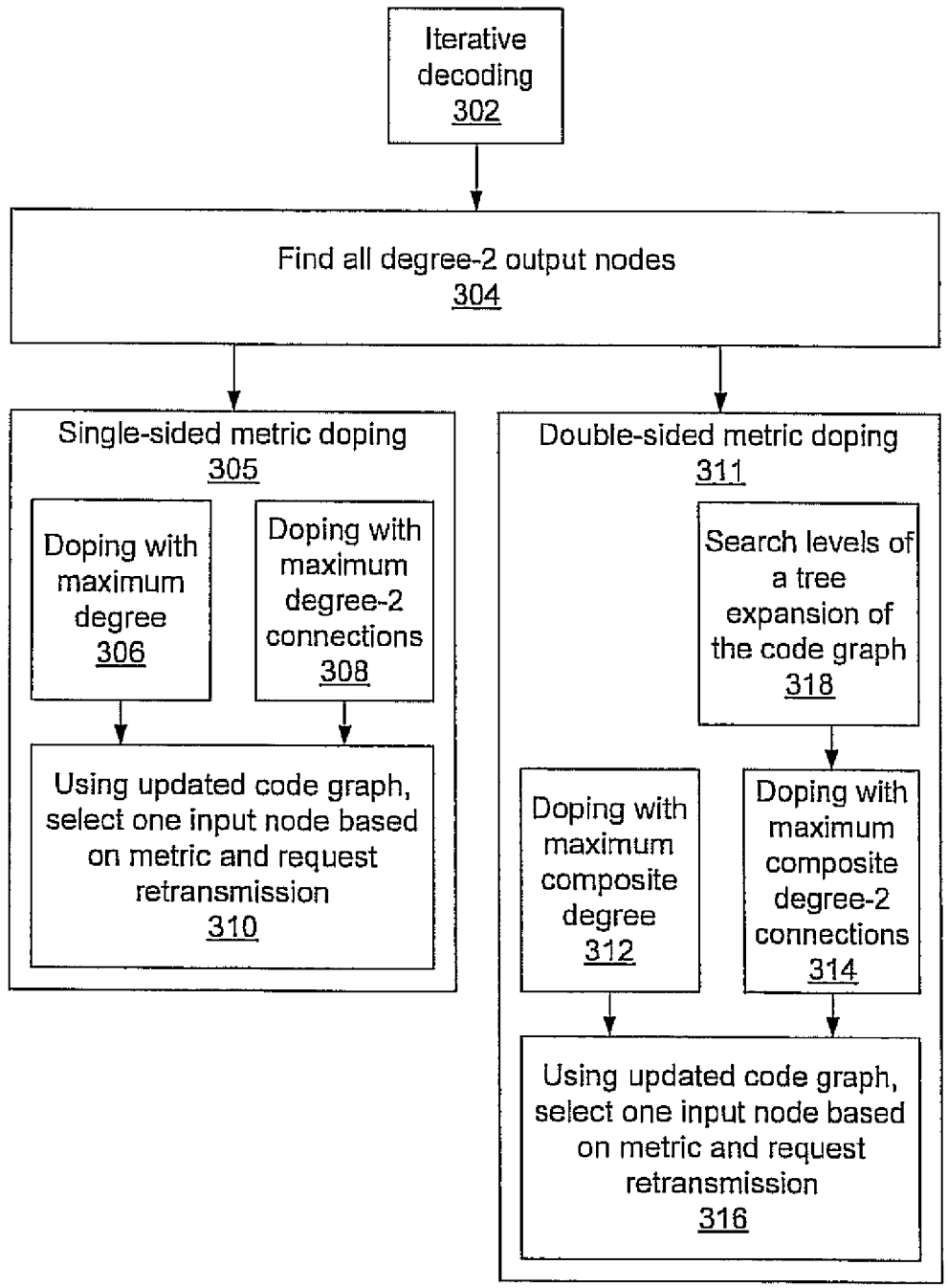
FIG. 3 is a block/flow diagram showing a method for selecting a doping node.

Referring now to FIG. 3, an exemplary doping method/system is shown. An LT decoder performs iterative message-passing decoding process and updates a code graph at block 302. Once the decoding process stops, doping selection then proceeds based on the latest updated graph. First, all degree-2 output nodes 208 in the most updated code graph are obtained at block 304. Then a doping symbol is selected for retransmission based on either a single-side metric (blocks 306-310) or a double-side metric (blocks 312-318).

When using a single-sided metric, shown in block 305, one input node 202 is selected out of all the input nodes 202 connected to any degree-2 output node 208, based on the updated code graph. The use of a single-side metric means that the metric is based on a property of the input node 202 itself. The selected node is then requested for transmission by sending its ID to the transmitter through a feedback channel at block 310.

Two types of single-sided metric are described herein, though it is contemplated that others may be implemented according to the present principles. Using a maximum degree, single-sided metric in block 306, the input node 202 with a highest degree value is selected for doping. If there are more than one such input nodes 202, an input node is randomly selected from the set having maximum degree.

A second metric is doping with maximum degree-2 connections in block 308. In this metric, an input node is selected having a highest number of connections to output nodes that are degree-2. This metric obtains the maximum number of ripple nodes from the doped node after one decoding iteration. Again, if there are multiple nodes which have the highest number of connections to degree-2 nodes, one is randomly selected for doping.

As an alternative to random selection of nodes if there are more than one candidates for doping in the above metrics, one may implement another metric as a tie-breaker. For example, if there are multiple input nodes having the highest number of degree-2 connections, the one having a maximum overall degree may be selected for doping.

Using a double-sided metric in block 311, for each pair of input nodes connected to a given degree-2 output node, the graph properties of the pair is checked, and the best pair is selected. One of the best pair is then selected for retransmission in block 316. As above, two double-sided metrics are discussed herein, but it is contemplated that other metrics may be used according to the present principles.

Block 312 incorporates doping with a maximum composite degree. The composite degree for a group of input nodes is the total number of output nodes connected to any input node in the group. For every degree-2 output node in an updated graph, the composite degree of the two input nodes connected to the output node is computed. Block 312 finds the pair having a highest composite degree and selects one node from the pair for doping.

Block 314 incorporates doping with a maximum composite of degree-2 connections. For every degree-2 output node in an updated graph, block 314 counts the composite degree-2 connections of the associated pair of input nodes. The pair having the largest number of composite degree-2 connections is selected, and one of the associated input nodes is chosen for doping.

As with single-sided metric doping 305, it is possible that there will be multiple pairs which satisfy the double-sided metric. In this case, random selection from the qualifying pairs may be used to determine which pair will be selected for doping. Alternatively, another metric may be applied to the pairs as a tie-breaker.

Figure 4:
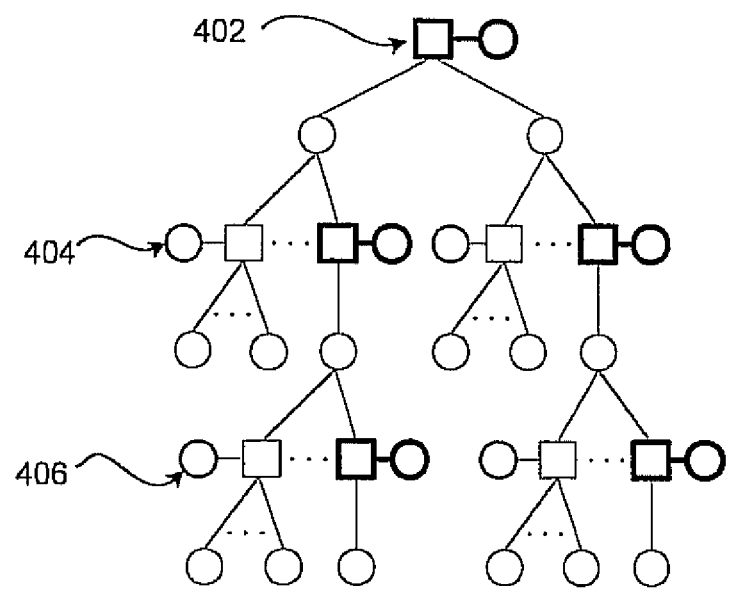
FIG. 4 is a diagram illustrating multiple levels of a tree expansion for a code graph.

Referring now to FIG. 4, performance may be further improved by evaluating composite degree-2 connections in several levels using the tree expansion of the code graph for the initial pair of input nodes in block 318. Although the tree expansion is shown with respect to the composite degree-2 metric, it may be employed with any of the metrics described herein. The degree-2 node 402 that is parent to the initial pair of input nodes serves as the root of the tree. The method for evaluating the composite degree-2 connections that fall within a certain number of levels, e.g., 404 and 406, through a tree expansion of the updated LT code graph is summarized below.

Figure 5:
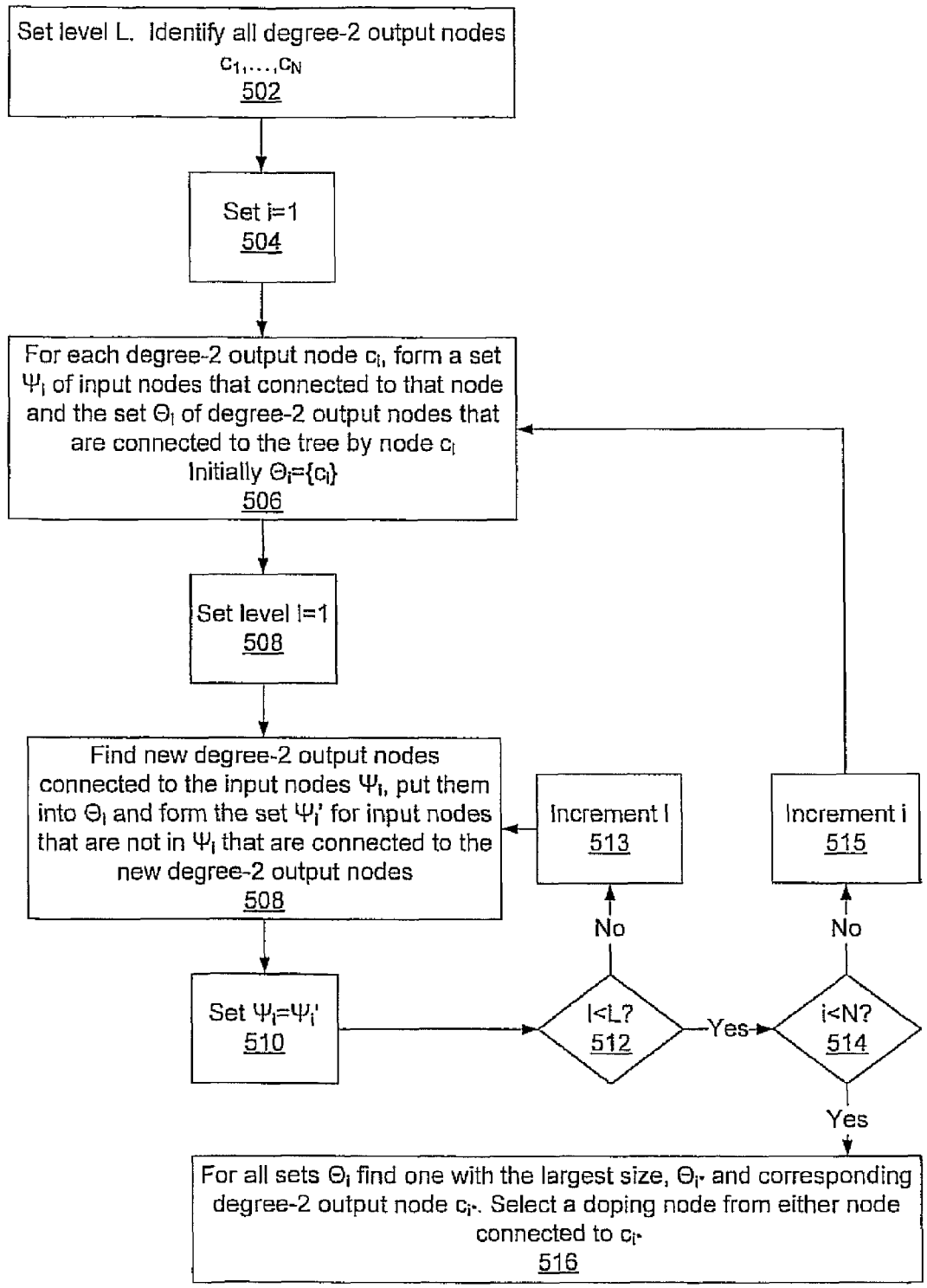
FIG. 5 is a block/flow diagram showing a method for selecting a doping node in a tree expansion for a code graph.

Referring now to FIG. 5, a block/flow diagram of a method for evaluating connections using such a tree expansion is shown. Block 502 initializes L as the number of search levels in a tree expansion. From the most updated code graph, all degree-2 output nodes $c_1, \ldots, c_N$ are identified, where N is the number of nodes. Block 504 then initializes an index i to 1. For each degree-2 output node $c_i$, block 506 forms a set $\Psi_i$ of all of the input nodes that connect to a 2-degree node $c_i$. Block 506 then forms a set $\Theta_i$ for the degree-2 nodes that are connected to the tree with root $c_i$. Initially, $\Theta_i = \{c_i\}$.

Block 508 initializes the level l=1. All degree-2 output nodes that are connected to any input node in the set $\Psi_i$ are put into the set $\Theta_i$. For each of the newly included degree-2 output nodes in $\Theta_i$, only one of the two input nodes connected to said newly included node will be in the set $\Psi_i$. The input nodes from said pairs which are not in $\Psi_i$ are put into a set $\Psi_i'$ at block 510. Block 510 then sets $\Psi_i = \Psi_i'$.

If the current level l is less than the number of search levels L at decision block 512, then l is incremented and processing returns to block 508. Otherwise, processing continues to decision block 514 which determines whether the current node index i is less than the total number of 2-degree nodes N. If so, i is incremented and processing returns to block 506. If not, block 516 finds the largest set $\Theta_{i*}$ from all the sets $\Theta_i$. The set $\Theta_{i*}$ corresponds to a degree-2 output node $c_{i*}$. Block 516 then selects an input node for doping from either of the two input nodes connected to output node $c_{i*}$.

To analyze the performance of doped LT decoding, one may consider the evolution of degree distributions for the output symbols. Instead of considering the degree evolution for d≧2 for each decoding iteration, degree evolution may be considered for each decoding step. In each step, only one input symbol is decoded and released from the code graph. During the $l^{th}$ decoding step 105, the released input symbol is uniformly selected at a random from k−l input nodes. Denote A as the random variable for the output degree, i.e., $A=|U_c|$. This gives the degree distribution of unreleased output symbols after l decoding steps given by:

$$\rho_l(d) \approx \frac{k}{k-l} Pr(A_{k-l} = d) = \rho(d), d = 2, \ldots, k-l,$$

which is another form of the ideal Soliton distribution.

The interdoping yield, defined as the number of decoded symbols between two dopings, is studied based on a random walk model. Denote $T_q$ as the time of the decoding step at which the qth doping occurs (i.e., $l=T_q$), and $Y_q$ as the interdoping yields (i.e., $Y_q=T_q-T_{q-1}$). Both $T_q$ and $Y_q$ are random variables. When a receiver collects n output symbols to decode, the overhead is $\delta=(n-k)/k=n/k-1$. Denote $\lambda_l^{(\delta)}$ as the overhead after the l th decoding step. Since the unreleased output symbol is approximated as $n^{(l)} \approx n-l$, then $$\lambda_l^{(\delta)} \approx \frac{n-l}{k-l} = 1 + \frac{k}{k-l}\delta,$$

which is an increasing function of l.

To describe the ripple evolution, the ripple increment may be investigated in one decoding step as follows. When one ripple node is processed in the decoder, if the ripple input node is connected to a degree-2 output node 208, one new ripple node is added. At the lth decoding step, there are $n^{(l)}\rho_l(2)$ output nodes and each has a probability of $p_2=2/(k-l)$ connected to the ripple node in processing. Therefore, the number of degree-2 output nodes 208 connected to this ripples node, $\lambda_l^{(\delta)}$, follows a binomial distribution and can be approximated as $$\eta_l(r) \triangleq Pr(\Delta_l^{(\delta)} = r) = \frac{(\lambda_l^{(\delta)})^r e^{-\lambda_l^{(\delta)}}}{r!},$$

which is a truncated Poisson distribution with mean $\lambda_l^{(\delta)}$ denoted as $f_p(r,\lambda_l^{(\delta)})$. Because processing one ripple node adds $\Delta_l^{(\delta)}$ new ripple nodes, the ripple increment $X_l=\Delta_l^{(\delta)}-1$ follows the distribution $\eta_l(r+1)$. This distribution is for one intermediate decoding step. For doping, one input node connected to a degree-2 output node 208 is transmitted, resulting in two ripple nodes. Therefore, with random doping, the ripple increment $X_l$ follows the shifted distribution $\eta_l(r-1)$.

To analyze the ripple evolution, the Markov Chain model is applied for ripple transitions during the decoding process. Denote $P_q$ as the probability transition matrix of the Markov Chain, with its entry $P_{q,vw}$ representing the transmission probability from the state v to w. Denote state 1 as the trapping state, where the decoding stops due to the vanished ripple. The state v corresponds to the ripple size of v−1. As a result, $P_{q,ll}=1$ and $$P_{q,vw} = \begin{cases} \eta_l(r+1), & w=v+r, v=2,\ldots,k, \\ & r=-1,\ldots,\min\{n^{(l)}/2, k-v\} \\ 0, & \text{otherwise,} \end{cases}$$

where $l=T_q$. Then the k×k transition matrix is given by $$P_q = \begin{bmatrix} 1 & 0 & 0 & \ldots & \ldots & 0 \\ \eta(0) & \eta(1) & \eta(2) & \ldots & \ldots & 0 \\ 0 & \eta(0) & \eta(1) & \eta(2) & \ldots & 0 \\ \vdots & \vdots & \vdots & \vdots & \vdots & \vdots \\ 0 & 0 & \ldots & \ldots & \eta(0) & \eta(1) \end{bmatrix}$$

With random doping, the ripple size is initially 2. Thus, v=3. Due to random doping, the probability transition matrices in the Markov chain for the initial transitions when processing these two ripple nodes are the same as that in the intermediate decoding process. Thus, starting at the qth random doping, the probability of entering the trapping state (state 1) again at any $l>T_q$ is given by $$p_l^{(T_q)}=[0\ 0\ 1\ 0\ldots 0]P_q^{(l-T_q)}[1\ 0\ \ldots,0]^T = e_3^T P_q^{(l-T_q)} e_1,$$

where $e_i$ an all-zero vector with only the ith entry being 1. Although the distribution of the ripple increment, $\eta_l(r)$, is a function of decoding step l, it may be assumed that $\eta_l(r)$ does not change between two dopings (i.e., $\eta_{l=T_q}(r)$ is used). Then the probability of entering the trapping state at the l th decoding step is then given by $$p^{(T_q)}(s)=e_3^T(P_q^{(s)}-P_q^{(s-1)})e_1$$

where $s=l-T_q$. The probabilities of interdoping yield $Y_q$ can be obtained by evaluating $p^{(T_q)}(s)$ (i.e., $Pr(Y_q=s)=p^{(T_q)}(s)$), $$Pr(Y_q=0)=Pr(Y_q=1)=0,$$

$$Pr(Y_q=s)=$$

$$\eta_{T_{q-1}}(0)\left(\eta_{T_{q-1}}^{(s-1)}(s-2)-\sum_{i=1}^{s-2}Pr(Y_{q-1}=s-1-i)\eta_{T_{q-1}}^{(i)}(i+1)\right)$$

where $\eta_{T_{q-1}}^{(s)}(d)$ is the sth convolution of the distribution $\eta_{T_{q-1}}(\bullet)$ evaluated at d, which is also a Poisson distribution with mean $s\lambda_{T_{q-1}}^{(\delta)}$.

Since $s\lambda_{T_{q-1}}^{(\delta)}$ is a random variable and the doping time $T_{q-1}$ is a Markov chain, the number of decoded symbols after the Qth doping, $D_Q=\Sigma_{q=1}^Q Y_q$, is a Markov-modulated random walk. To simplify the evaluation of the average number of doping iterations, the expectation of $T_{q-1}$, $t_q=\Sigma_{j=1}^{q-1} E\{Y_q | T_{j-1}=t_j\}$, is used to replace $T_{q-1}$. Then $D_Q$ can be approximated as $$D_Q \approx t_{Q-1} + \sum_{q=1}^{Q} E\{Y_q | T_{q-1}=t_q\},$$

where $E\{Y_q|T_{q-1}=t_q\}$ given by:

$$E\{Y_q | T_{q-1}=t_q\} \approx \sum_{j=1}^{k-t_q} jPr(Y_q=j)+\left(1-\sum_{j=1}^{k-t_q}Pr(Y_q=j)\right)(k-t_q).$$

Then the average number of doping iterations can be evaluated by computing the maximum Q based the above two equations with the constraint $D_Q<k$.

For analysis of doping with the single-side metric 305, as discussed above with regard to FIG. 3, without loss of generality, it may be assumed that the doping node is first processed. Given the distribution of the number of new nodes added to the ripple when processing the doping node, $\xi_l(r) \triangleq Pr(\Delta_l^{(s)}=r)$, the probability transition matrix $Q_q$ for the transition of the ripple size may be defined by the proposed doping node, which is similar to $P_q$. The above probability transition matrix is only for processing the doping node. The transition probabilities of the ripple size for processing the other node are the same as that of the intermediate decoding steps, i.e., $P_q$, for the qth doping. Hence, for doping with the single-side metric 305, one can still assume that the initial ripple size is 2 right after doping (i.e., the initial state v=3). Therefore, the probability of entering the trapping state at any time $l>T_q$ is $p_l^{(T_q)}(s)=e_3^T Q_q P_q^{(l-1-T_q)e} e_1$, and one can then obtain the probability of entering the trapping state at the sth step after $T_q$, given by $$p^{(T_q)}(s)=e_3^T Q_q(P_q^{(s-1)}-P_q^{(s-2)})e_1.$$

The probabilities of the interdoping yield $Y_q$ is then given by $$Pr(Y_q=0)=Pr(Y_q=1)=0,$$

$$Pr(Y_q=2)=\xi_{T_{q-1}}(0)\eta_{T_{q-1}}(0),$$

$$Pr(Y_q=s)=\eta_{T_{q-1}}(0)\left(\begin{array}{l}\sum_{j=0}^{J}\xi_{T_{q-1}}(j)\eta_{T_{q-1}}^{(s-2)}(s-2-j)-\\ \sum_{i=1}^{s-3}Pr(Y_{q-1}=s-2-i)\eta_{T_{q-1}}^{(i)}(i+1)\end{array}\right)$$

where $J=\min\{s-2,\eta^{(l)}/2+1\}$ and $s=2,\ldots,k$.

State transition probabilities $\{\xi_{T_q}(r)\}$ can now be obtained. With random doping, the number of connections to the degree-2 output nodes, $\Delta_l^{(\delta)}$, follows the distribution $\eta_l(r)$. After l decoding steps, there are k−l input nodes left. For the second approach, i.e., doping with maximum degree-2 connections 308, the number of connections to the degree-2 output nodes is $\Delta_{l,MD2}^{(\delta)}=\max\{\Delta_{l,1}^{(\delta)},\ldots,\Delta_{l,k-l}^{(\delta)}\}$. The distribution of $\xi_l(r)$ for the doping with maximum degree-2 connections 308 is given by:

$$\xi_{l,MD2}(r)=Pr(\Delta_{l,MD2}^{(\delta)}=r)=\begin{cases}\eta_l(0)^{k-l}, & r=0 \\ \eta_l(r)^{k-l}-\eta_l(r-1)^{k-l}, & r=1,\ldots,n^{(l)}/2.\end{cases}$$

For the first approach, the doping with maximum degree, $\xi_l(r)$ 306 may be obtained as follows. First, the degree of the undecoded input nodes can be approximated as the Poisson distribution, $\gamma_l(d_v) = f_p(d_v, \bar{d}_u^{(l)})$, $d_v = 1, \ldots, n-l$, with the average degree $\bar{d}_u^{(l)}$ as the mean, where $$\bar{d}_u^{(l)} = \frac{n-l}{k-l} \sum_{d=1}^{n-l} d\rho_l(d).$$

Based on the order statistics, the distribution for maximum degree $d_{v,max}$ is given by $$\gamma_{l,max}(d_v) \triangleq Pr(d_{v,max} = d_v) = \begin{cases} \gamma_l(1)^{k-l}, & r = 1 \\ \gamma_l(d_v)^{k-l} - \gamma_l(d_v - 1)^{k-l}, & d_v = 2, \ldots, n^{(l)}. \end{cases}$$

Denote $p_2'$ as the ratio of the edges connected to degree-2 output nodes, where $$p_2' = \frac{2\rho_l(2)}{\sum_{d=1}^{n-l} d\rho_l(d)}.$$

For any input node of degree-$d_v$, the number of the connections to degree-2 output nodes $r$ follows a binomial distribution $\mathcal{E}(d_v, p_2')$. The distribution $\xi_l(r)$ for the first approach is given by $$\xi_{l,MD}(r) = \sum_{j=r}^{k-l} \gamma_{l,max}(j) \binom{j}{r} p_2'^r (1-p_2')^{j-r}.$$

The state transition matrix $Q_q$ may then be formed by $\xi_{l,MD}(r)$ for the doping with maximum degree and by $\xi_{l,MD2}(r)$ for the doping with maximum degree-2 connections.

When doping with a double-sided metric 311, the double-side metric is for a pair of nodes connected to a degree-2 output nodes 208. The ripple evolution cannot be treated as two separately state transition nodes in a Markov chain. As such, the processing of two nodes may be combined and treated as one composite doping node. Denote $\varsigma_l(r)$ as the distribution of the number of new ripple nodes after processing both the doping node and its sibling node which shares the same mother degree-2 output node, i.e., the composite doping node. By dropping the subscript for simplicity, the probability transition matrix $\tilde{Q}_q$ is formed in a similar manner to $P_q$. The state transition probabilities for the subsequence decoding steps remain the same as in the transition matrix $P_q$ for the qth doping iteration. Because the composite is being considered, the initial ripple size is then one and the initial state is $v = 2$. Therefore, the probability of entering trapping state at any time $l > T_q$ is $$P_l^{(T_q)} = e_2^T \tilde{Q}_q P_q^{(l-1-T_q)} e_1.$$

The probability of entering the trapping state at the sth decoding step after the time $T_q$ may then be obtained, given by $$p^{(T_q)}(s) = e_2^T \tilde{Q}_q (P_q^{(s-1)} - P_q^{(s-2)}) e_1.$$

Following the similar procedures, the probabilities of the interdoping yield $Y_q$ for the doping with double-side metric may be obtained, given by $$Pr(Y_q = 0) = 0,$$
$$Pr(Y_q = 1) = \varsigma_{T_{q-1}}(0),$$
$$Pr(Y_q = 2) = \varsigma_{T_{q-1}}(1)\eta_{T_{q-1}}(0),$$
$$Pr(Y_q = s) =$$
$$\eta_{T_{q-1}}(0) \left( \sum_{j=0}^{J} \varsigma_{T_{q-1}}(j) \eta_{T_q}^{(s-2)}(s-1-j) - \sum_{i=1}^{s-3} Pr(Y_q = s-2-i) \eta_{T_{q-1}}^{(i)}(i+1) \right)$$

Because the interdoping yield $Y_q$ defined here includes a composite node, the actually yield $Y_q' = Y_q + 1$. Therefore, the expected value of the yield is $$E\{Y_q' | T_{q-1} = t_q\} = 1 + E\{Y_q | T_{q-1} = t_q + 1\}.$$

Consequently, $$D_Q \approx \sum_{q=1}^{Q} E\{Y_q' | T_{q-1} = t_q\}.$$

Then the average number of doping iterations can be evaluated by computing the maximum $Q$ based on the above two equations with the constraint $D_Q < k$.

The distribution $\varsigma_l(r)$ may now be derived for both approaches. For the doping with maximum degree-2 connections 314, the degree-2 connections for a pair of nodes are first evaluated. For a single node, the distribution of the number of degree-2 connections follows $\eta_l(r)$. Therefore, for two nodes, the resulting distribution is the convolution of two $\eta_l(r)$, i.e., $\eta_l^{(2)}(r)$, resulting in a Poisson probability distribution function with mean $2\lambda_l^{(s)}$. Because there are total $n^{(l)}/2$ degree-2 output nodes and, consequently, $n^{(l)}/2$ pairs of input nodes, the distribution of $r$ connections to degree-2 output nodes for the composite doping node is given by $$\varsigma_l'(r) = \begin{cases} \eta_l^{(2)}(0)^{n^{(l)}/2}, & r = 0, \\ \eta_l^{(2)}(r)^{n^{(l)}/2} - \eta_l^{(2)}(r-1)^{n^{(l)}/2}, & r = 1, \ldots, n^{(l)}/2. \end{cases}$$

In double-side metric where two input nodes share one common degree-2 output node, the final distribution of $\varsigma_l(r)$ can be approximated as $$\varsigma_{l,MD2}(r) = \begin{cases} \varsigma_l'(0) + \varsigma_l'(1), & r = 0 \\ \varsigma_l'(r+1), & r = 1, \ldots, n^{(l)}/2. \end{cases}$$

For the first doping approach with maximum composite degree 312, the composite degree distributions of two input nodes is obtained. Because the degree of input nodes follows a Poisson distribution, $\gamma_l(d_v) = f_p(d_v, \bar{d}_u^{(l)})$, $d_v = 1, \ldots, n-1$, with a formula for $\bar{d}_u^{(l)}$ given above. The distribution of sum-degree for two input nodes is also a truncated Poisson distribution, e.g., $\gamma_l^{(2)}(d_v) = f_p(d_v, 2\bar{d}_u^{(l)})$, $d_v \leq 2$. Then the maximum of the composite degree is given by $$\gamma_{l,max}^{(2)}(d_v) = \gamma_l^{(2)}(d_v)^{n^{(l)}/2} - \gamma_l^{(2)}(d_v - 1)^{n^{(l)}/2}.$$

Each pair of input nodes shares at least one degree-2 output node. Thus, to evaluate the number of degree-2 nodes connected to the input pair, the two connections to one mother degree-2 node are treated as one composite connection. It may be assumed such treatment does not affect the probability of one edge connected to a degree-2 output nodes $p_2'$. Therefore, $$\varsigma_{l,MD}(r) = \sum_{j=r}^{k-l-1} \gamma_{l,max}^{(2)}(j+1)\binom{j}{r}p_2''^r(1-p_2')^{j-r}.$$

The state transition matrix $\tilde{Q}_l$ a may then be formed by $\varsigma_{l,MD}(r)$ for doping with maximum degree and by $\varsigma_{l,MD2}(r)$ for doping with maximum degree-2 connections to evaluate the average number of doping iterations.

Figure 6:
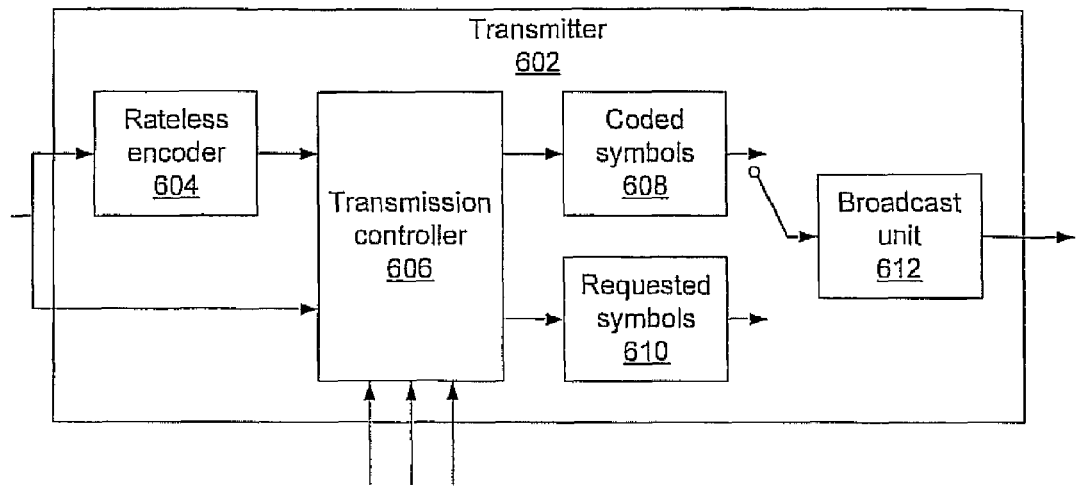
FIG. 6 is a diagram of a transmitter that performs rateless symbol retransmission.

Referring now to FIG. 6, a transmitter 602 is shown that supports doped decoding retransmission with limited feedback. The transmitter 602 receives information in the form of bits or packets. This information passes to a rateless encoder 604 which produces rateless symbols. The rateless symbols pass to a transmission controller 606 which first sends out coded symbols 608 for transmission to one or more receivers by broadcast unit 612. Transmission controller 606 also receives one or more feedback channels from one or more receivers. Based on the feedback channels, transmission controller 606 determines which information to retransmit. This requested symbols 610 are then transmitted by broadcast unit 612 to the one or more receivers. In such a transmitter 602, the transmission controller 606 determines which symbols to send and when, based on the principles described above.

Figure 7:
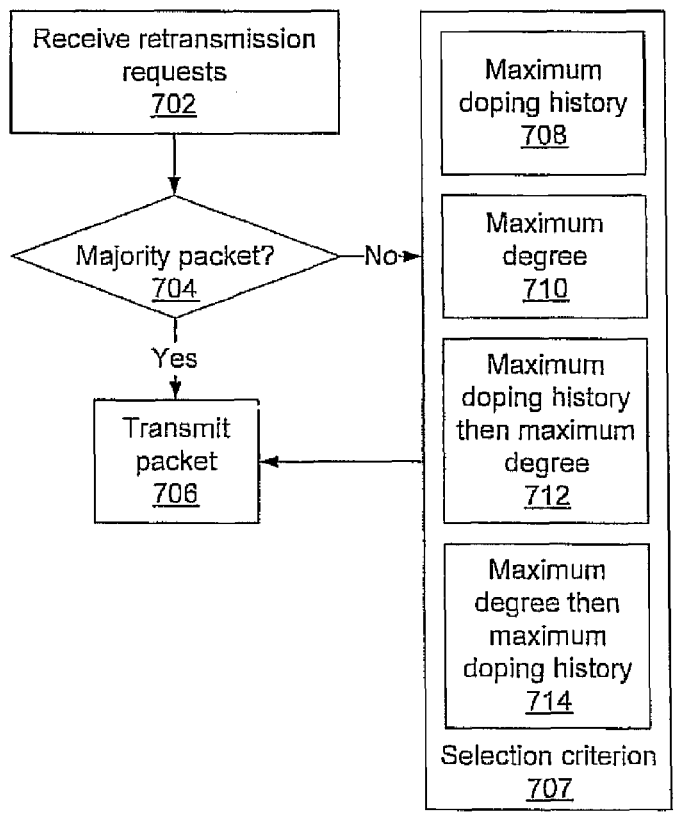
FIG. 7 is a block/flow diagram of a method for selecting a packet for retransmission from multiple requests.

Referring now to FIG. 7, a method for selecting symbols for retransmission is shown. As noted above, the transmission controller 606 receives one or more retransmission requests at block 702 via feedback channels. If there is a packet which is requested by a plurality of the received requests, that packet is selected at block 704 by the transmission controller 606 and transmitted at block 706 using the broadcast unit 612. Similarly, if there is only one request, the requested packet is selected as the majority packet at block 704 and transmitted at block 706. If there is no clear plurality, however, a selection criterion 707 is applied. This selection criterion may be one of several criteria, including selection of the request with the maximum doping history 708, maximum doping degree, 710, or a combination of the two. For example, maximum doping history may be applied, followed by maximum degree 712 or vice versa 714. The selected packet is then transmitted at block 706.

Regarding maximum doping history selection in blocks 708 and 714, a doping packet is selected from the user with the most retransmitted requests in previous doping iterations. A counter c(k) is set for each user k that tracks the number of times a particular doping request is selected. At each doping iteration, the users send a request to the transmitter. The transmitter then selects one packet from those requests. If the retransmitted packet is the requested packet for a user k, the user increments c(k). Then, if maximum doping history 708 or 714 is applied for packet selection 707, the packet requested by the user with the highest c(k) value is selected.

Figure 8:
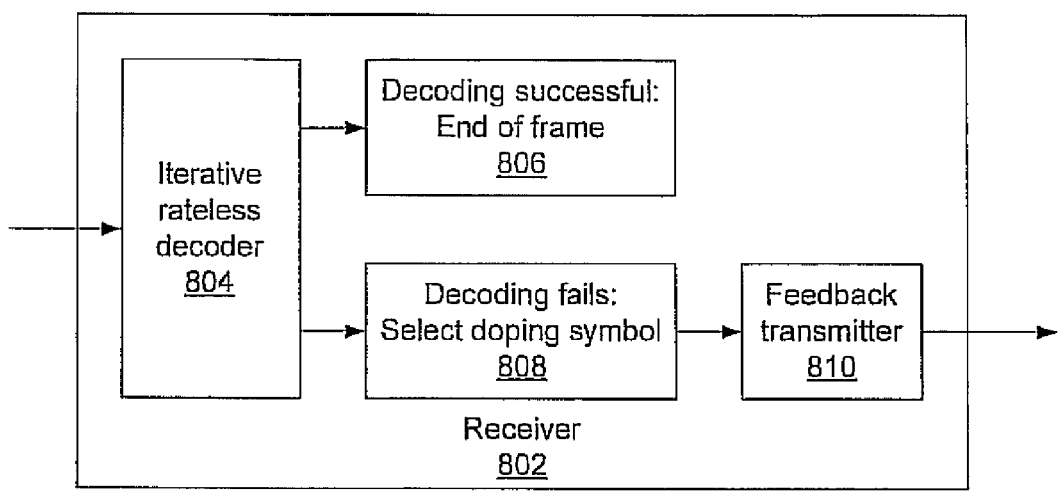
FIG. 8 is a diagram of a receiver that performs doped rateless decoding.

Referring now to FIG. 8, a receiver 802 is shown that supports doped decoding retransmission with limited feedback. The receiver 802 receives rateless coded symbols and attempts to decode them with an iterative rateless decoder 804. If decoding succeeds, the frame ends at block 806 and decoding the next symbol may begin. If decoding fails, a doping request mechanism 808 selects a symbol for doping according to, e.g., the method described above in reference to FIG. 3. The selecting doping symbol is then transmitted by the receiver 802 along a feedback channel to a transmitter.

Having described preferred embodiments of a system and method for doped rateless decoding with limited feedback (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for doped rateless decoding, comprising:
receiving ratelessly coded symbols;
attempting to decode the coded symbols using a processor by creating an associated code graph that represents the structure of the rateless code used by the symbols;
if the decoding attempt fails, selecting an input node from the code graph using a metric that gauges a number or a degree value of connections to the input node based on the code graph structure; and
requesting retransmission of the selected input node by a feedback channel.

2. The method of claim 1, wherein the metric is a single-side metric.

3. The method of claim 2, wherein the single-side metric selects an input node having with a highest degree value.

4. The method of claim 2, wherein the single-side metric selects an input node having a highest number of degree-2 connections.

5. The method of claim 1, wherein the metric is a double-side metric.

6. The method of claim 5, wherein the double-side metric selects an input node having a highest composite degree value.

7. The method of claim 5 wherein the double-side metric selects an input node having a highest number of composite degree-2 connections.

8. The method of claim 7, wherein the double-side metric further includes searching and evaluating composite degree-2 connections across multiple levels of a tree expansion of the code graph.

9. A method for rateless doped retransmission, comprising:
receiving retransmission requests from one or more feedback channels;
selecting a ratelessly encoded packet requested by two or more of the feedback channels using a processor;
if there is no ratelessly encoded packet requested by two or more of the feedback channels, selecting a ratelessly encoded packet according to a doping transmission criterion; and
retransmitting the selected packet to one or more receivers.

10. The method of claim 9, wherein the doping transmission criterion includes selecting a packet having a maximum doping history.

11. The method of claim 9, wherein the doping transmission criterion includes selecting a packet having a maximum degree.

12. A receiver, comprising:
a decoder configured to decode received coded symbols using a processor by creating an associated code graph that represents the structure of the rateless code used by the symbols;

a doping request mechanism configured to select an input node from the code graph using a metric that gauges a number or a degree value of connections to the input node based on the code graph structure if the decoder fails to decide a received symbol; and a feedback transmitter configured to request retransmission of the selected input node by a feedback channel.

13. The receiver of claim 12, wherein the metric is a single-side metric.

14. The receiver of claim 13, wherein the single-side metric selects an input node having with a highest degree value.

15. The receiver of claim 13, wherein the single-side metric selects an input node having a highest number of degree-2 connections.

16. The receiver of claim 12, wherein the metric is a double-side metric.

17. The receiver of claim 16, wherein the double-side metric selects an input node having a highest composite degree value.

18. The receiver of claim 16, wherein the double-side metric selects an input node having a highest number of composite degree-2 connections.

19. The receiver of claim 18, wherein the double-side metric further includes an evaluation of composite degree-2 connections across multiple levels of a tree expansion of the code graph.

20. A transmitter, comprising:

a feedback receiver configured to receive retransmission requests from one or more feedback channels;

a transmission controller configured to select a packet requested by two or more of the feedback channels using a processor and, if there is no ratelessly encoded packet requested by two or more of the feedback channels, configured to select a packet according to a doping transmission criterion; and a broadcast unit configured to transmit the selected packet to one or more receivers.

21. The transmitter of claim 20, wherein the doping transmission criterion includes a maximum doping history.

22. The transmitter of claim 20, wherein the doping transmission criterion includes a maximum degree.

* * * * *